(12) United States Patent
Hsu et al.

(10) Patent No.: US 11,785,868 B2
(45) Date of Patent: Oct. 10, 2023

(54) SEMICONDUCTOR STRUCTURE AND METHOD OF FORMING THE SAME

(71) Applicant: Winbond Electronics Corp., Taichung (TW)

(72) Inventors: Po-Yen Hsu, Taichung (TW); Bo-Lun Wu, Taichung (TW); Tse-Mian Kuo, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 195 days.

(21) Appl. No.: 17/525,079

(22) Filed: Nov. 12, 2021

(65) Prior Publication Data

US 2022/0293851 A1 Sep. 15, 2022

(30) Foreign Application Priority Data

Mar. 9, 2021 (TW) .................................. 110108278

(51) Int. Cl.
*H10N 70/00* (2023.01)
*H10N 70/20* (2023.01)

(52) U.S. Cl.
CPC .......... *H10N 70/826* (2023.02); *H10N 70/011* (2023.02); *H10N 70/24* (2023.02)

(58) Field of Classification Search
CPC ..... H10N 70/826; H10N 70/011; H10N 70/24
See application file for complete search history.

(56) References Cited

U.S. PATENT DOCUMENTS 10,497,865 B2 12/2019 Chen
2017/0279041 A1 9/2017 Chen

*Primary Examiner* — Marvin Payen
(74) *Attorney, Agent, or Firm* — MUNCY, GEISSLER, OLDS & LOWE, P.C.

(57) ABSTRACT

A semiconductor structure includes a substrate, a first electrode, a vacancy supply layer, a sidewall barrier layer, an oxygen reservoir layer, a resistive switching layer, and a second electrode. The first electrode is disposed on the substrate. The vacancy supply layer is disposed on the first electrode. The sidewall barrier layer is disposed on the first electrode. The oxygen reservoir layer is disposed on the first electrode. The sidewall barrier layer is disposed between the oxygen reservoir layer and the vacancy supply layer. The resistive switching layer is disposed on the vacancy supply layer. The second electrode is disposed on the resistive switching layer.

17 Claims, 5 Drawing Sheets

SEMICONDUCTOR STRUCTURE AND METHOD OF FORMING THE SAME

CROSS REFERENCE TO RELATED APPLICATIONS

This Application claims priority of Taiwan Patent Application No. TW110108278, filed on Mar. 9, 2021, the entirety of which is incorporated by reference herein.

BACKGROUND

Field of the Invention

Some embodiments of the present disclosure relate to a semiconductor structure and a method for forming the same, and, in particular, to a semiconductor structure providing two kinds of current paths at the same time, and a method for forming the same.

Description of the Related Art

Generally, electronic memory may be classified into volatile memory and non-volatile memory. Among non-volatile memories, resistive random access memory (RRAM) may switch resistance in a short time and have a small operating current and voltage. Also, resistive random access memory may have excellent repetitive read and write endurance and memory retention and have a simple structure. Therefore, the development of resistive random access memory has attracted much attention.

The switching mechanism of resistive random access memory includes forming, reset, and set. During the process of forming, the current is conducted via the filament path. During reset, the low-resistance state (LRS) is switched to the high-resistance state (HRS). During set, the high-resistance state is switched to the low-resistance state. However, during the process of forming, the low-resistance state can easily be affected by the high temperature and may deteriorate. In addition, the filament path is also easily damaged.

Although the existing semiconductor structures and methods for forming have gradually met their intended purposes, they have not yet fully met the requirements in all respects. Therefore, there are still some problems to be overcome regarding semiconductor structures that may be used as a resistive random access memory after further processing and its formation method.

SUMMARY

In view of the above problems, some embodiments of the present disclosure further include an oxygen reservoir layer disposed under a resistive switching layer and a vacancy supply layer surrounded by a barrier layer and under the resistive switching layer, wherein the barrier layer is used as an oxygen diffusion barrier layer. Thus, the semiconductor structure has both an oxygen-ion conduction path and a vacancy conduction path at the same time, to improve the electrical feature.

According to some embodiments of the present disclosure, a semiconductor structure is provided. The semiconductor structure includes a substrate, a first electrode, a vacancy supply layer, a sidewall barrier layer, an oxygen reservoir layer, a resistive switching layer, and a second electrode. The first electrode is disposed on the substrate. The vacancy supply layer is disposed on the first electrode. The sidewall barrier layer is disposed on the first electrode. The oxygen reservoir layer is disposed on the first electrode. The sidewall barrier layer is disposed between the oxygen reservoir layer and the vacancy supply layer. The resistive switching layer is disposed on the vacancy supply layer. The second electrode is disposed on the resistive switching layer.

According to some embodiments of the present disclosure, a method for forming a semiconductor structure is provided. The method for forming the semiconductor structure includes forming a first electrode on a substrate. A vacancy supply layer is formed on the first electrode. A sidewall barrier layer is formed on the first electrode. An oxygen reservoir layer is formed on the first electrode. Wherein, the sidewall barrier layer is disposed between the oxygen reservoir layer and the vacancy supply layer. A resistive switching layer is formed on the vacancy supply layer. A second electrode is formed on the resistive switching layer.

The semiconductor structures of the present disclosure may be applied in various types of semiconductor devices. In order to make the features and advantages of some embodiments of the present disclosure more understand, some embodiments of the present disclosure are listed below in conjunction with the accompanying drawings, and are described in detail as follows.

DETAILED DESCRIPTION

FIGS. 1-8 are schematic cross-sectional views of a semiconductor structure 1 at various stages of formation, according to some embodiments of the present disclosure.

Figure 1:
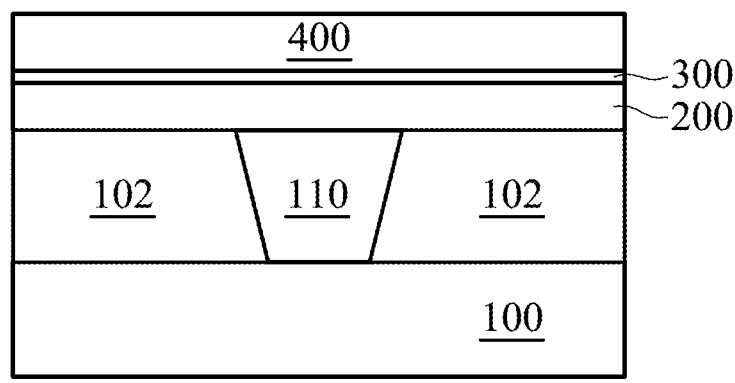
FIGS. 1-8 are schematic cross-sectional views of a semiconductor structure at various stages of formation, according to some embodiments of the present disclosure.

Referring to FIG. 1, in some embodiments, a first dielectric layer 102 is formed on an substrate 100, and a first contact plug 110 is formed in the first dielectric layer 102. In some embodiments, the substrate 100 may be, for example, a wafer, such as a silicon wafer; a bulk semiconductor or a semiconductor-on-insulation (SOI) substrate. In some embodiments, the first dielectric layer 102 may include or may be silicon oxide, silicon nitride, silicon oxynitride, low dielectric constant (low-k) dielectric materials, combinations thereof, or any other suitable dielectric materials, but the disclosure is not limited thereto.

In some embodiments, the first dielectric layer 102 may be formed on the substrate 100 by a deposition process.

In some embodiments, after the first dielectric layer 102 is formed on the substrate 100 and before other subsequent layers are formed on the first dielectric layer 102, the first dielectric layer 102 is patterned to form a first via in the first dielectric layer 102. Wherein, the patterning process may be performed by using a hard mask and/or a photoresist layer including oxide, nitride, or a combination thereof, and an etching process, but the disclosure is not limited thereto. In addition, in some embodiments, the photoresist layer may be further removed by an ashing process and/or a wet strip process.

Next, a first conductive material is filled in the first via, and the first conductive material on the first dielectric layer 102 may be removed by performing a planarization process, so that a top surface of the first conductive material filled in the first via is coplanar with the top surface of the first dielectric layer 102. Thus, a first contact plug 110 is formed in the first dielectric layer 102. In some embodiments, the width of the first via gradually increases in the direction away from the first dielectric layer 102. In other words, the first via may have a wide top and a narrow bottom. In some embodiments, the first conductive material may include or may be a metal material, a conductive material, a combination thereof, or other suitable materials, but the present disclosure is not limited thereto.

As shown in FIG. 1, in some embodiments, the first electrode 200 is formed on the substrate 100, specifically, on the first dielectric layer 102. In some embodiments, the first electrode 200 is formed on the first dielectric layer 102 and the first contact plug 110 disposed in the first dielectric layer 102, so that the first electrode 200 is in contact with the first contact plug 110. The first electrode 200 is electrically connected with the first contact plug 110. In some embodiments, the first electrode 200 may include or may be a conductive material. The conductive material may include polycrystalline silicon, amorphous silicon, metal, metal nitride, conductive metal oxide, combinations thereof, or other suitable materials, but the present disclosure is not limited thereto. In some embodiments, the first electrode 200 may be formed on the first dielectric layer 102 by the aforementioned deposition process or other suitable processes.

As shown in FIG. 1, in some embodiments, a bottom barrier layer 300 is formed on the first electrode 200, so that the first electrode 200 is between the substrate 100 and the bottom barrier layer 300. In some embodiments, the first dielectric layer 102 is disposed on the first electrode 200, and the first electrode 200 is disposed between the first dielectric layer 102 and the bottom barrier layer 300. In some embodiments, the bottom barrier layer 300 is located between the first electrode 200 and a subsequently formed vacancy supply layer and between the first electrode 200 and a subsequently formed oxygen reservoir layer. In some embodiments, the bottom barrier layer 300 may include oxide, nitride, combinations thereof, or other suitable materials, wherein the material of the bottom barrier layer 300 has the ability to block the diffusion of oxygen ions. In some embodiments, the bottom barrier layer 300 may include or may be aluminum oxide ($Al_2O_3$) and/or zirconium oxide (ZrO).

In some embodiments, the bottom barrier layer 300 may serve as an oxygen diffusion barrier layer that blocks the diffusion of oxygen ions. Therefore, the bottom barrier layer 300 can prevent the oxygen ions from crossing the bottom barrier layer 300. In some embodiments, since a subsequently formed resistive switching layer and the subsequently formed oxygen reservoir layer are in contact with each other, oxygen ions from the resistive switching layer can diffuse into the oxygen reservoir layer. The bottom barrier layer 300 is disposed on the oxygen reservoir layer to correspond with the resistive switching layer. For example, the bottom barrier layer 300 is disposed on the other side of the oxygen reservoir layer where the resistive switching layer is disposed, but the present disclosure is not limited thereto. Therefore, after the oxygen ions from the resistive switching layer diffusing into the oxygen reservoir layer, the bottom barrier layer 300 can prevent the oxygen ions from further diffusing from the oxygen reservoir layer into the bottom barrier layer 300.

As shown in FIG. 1, in some embodiments, a vacancy supply layer 400 is formed on the first electrode 200, specifically, on the bottom barrier layer 300. In some embodiments, the vacancy supply layer 400 is formed on the bottom barrier layer 300 by the aforementioned deposition process or using another suitable method. In some embodiments, the vacancy supply layer 400 may include or may be an oxide. In some embodiments, the vacancy supply layer 400 may be tantalum oxide (TaO) and/or hafnium oxide (HfO). In some embodiments, the vacancy supply layer 400 is used to provide vacancies capable of establishing conductive path.

Figure 2:
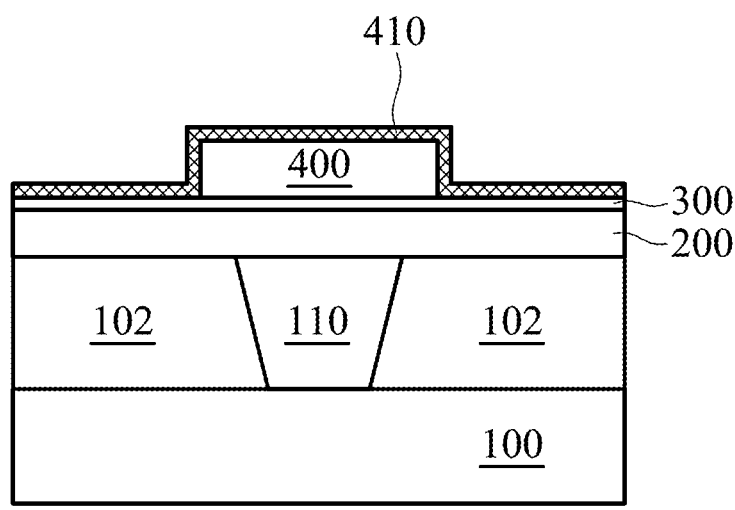

Referring to FIG. 2, in some embodiments, the vacancy supply layer 400 is patterned to correspond with the position of the first contact plug 110 disposed in the first dielectric layer 102, so as to define a memory cell of a subsequently formed resistive random access memory. In some embodiments, a patterning process is performed to remove the vacancy supply layer 400 that does not correspond with the first contact plug 110 and remain the vacancy supply layer 400 corresponding with the first contact plug 110. Therefore, the vacancy supply layer 400 may be disposed to correspond with the first contact plug 110, and a subsequently formed second contact plug may be disposed to correspond with the vacancy supply layer 400 and the first contact plug 110. Thus, the vacancy supply layer 400 is disposed between the first contact plug 110 and the subsequently formed second contact plug to obtain a maximum electric field. In some embodiments, the vacancy supply layer 400 may be disposed on the first contact plug 110, specifically, the vacancy supply layer 400 may be disposed above the first contact plug 110. In some embodiments, a projected area of the vacancy supply layer 400 covers a top surface of the first contact plug 110. In some embodiments, the projected area of the vacancy supply layer 400 is greater than or equal to the area of the top surface of the first contact plug 110.

As shown in FIG. 2, in some embodiments, a sidewall barrier layer 410 is formed on the first electrode 200, specifically, on the bottom barrier layer 300. In some embodiments, the sidewall barrier layer 410 is conformally formed on a top surface of the bottom barrier layer 300 and on a top surface and side surfaces of the vacancy supply layer 400, so that the bottom barrier layer 300 and the sidewall barrier layer 410 surround the vacancy supply layer 400. In some embodiments, the vacancy supply layer 400 is accommodated in a space formed by the bottom barrier layer 300 and the sidewall barrier layer 410. In some embodiments, optionally, the sidewall barrier layer 410 on the top surface of the bottom barrier layer 300 is removed by performing an etching process, and the sidewall barrier layer 410 on the top surface and the side surfaces of the vacancy supply layer 400 is remained.

In some embodiments, the sidewall barrier layer 410 may also serve as an oxygen diffusion barrier layer that blocks the diffusion of oxygen ions. Therefore, the sidewall barrier layer 410 can also prevent oxygen ions from crossing the sidewall barrier layer 410. In some embodiments, the sidewall barrier layer 410 is disposed between the bottom barrier layer 300 and a subsequently formed resistive switching layer. A bottom surface of the sidewall barrier layer 410 is in contact with the bottom barrier layer 300. A top surface of the sidewall barrier layer 410 is in contact with the subsequently formed resistive switching layer. Thus, the sidewall barrier layer 410 effectively divides a space between the bottom barrier layer 300 and the subsequently formed resistive switching layer. In some embodiments, the sidewall barrier layer 410 may include the same or different material as the bottom barrier layer 300. In some embodiments, the sidewall barrier layer 410 may include oxide, nitride, combinations thereof, or other materials capable of blocking the diffusion of oxygen ions. In some embodiments, the sidewall barrier layer 410 may include or may be aluminum oxide and/or zirconium oxide.

Figure 3:
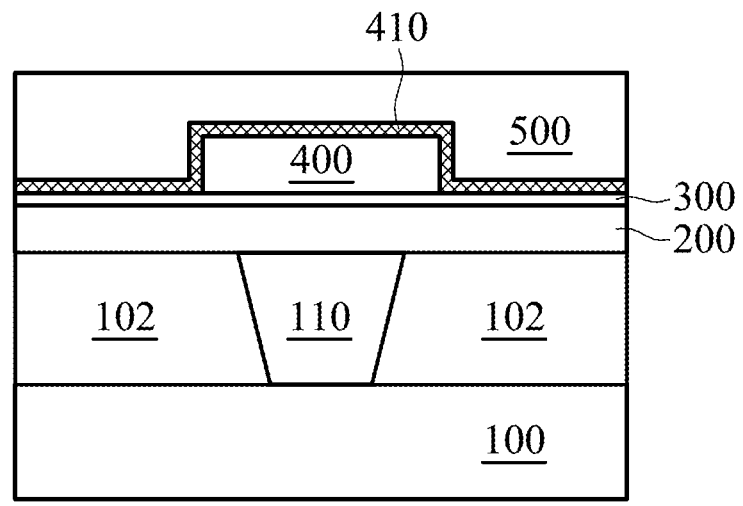
Figure 4:
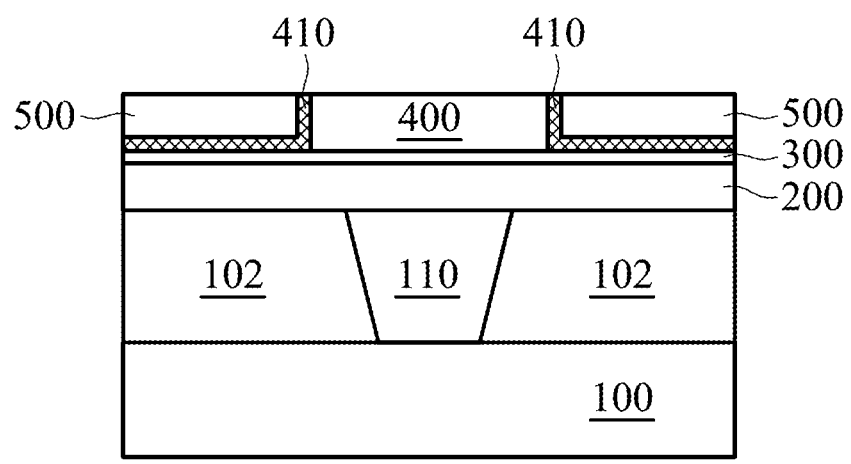

Referring to FIGS. 3 and 4, in some embodiments, an oxygen reservoir layer 500 is formed on the first electrode 200, specifically, on the bottom barrier layer 300. Therefore, the sidewall barrier layer 410 is disposed between the oxygen reservoir layer 500 and the vacancy supply layer 400. In some embodiments, the formation of the oxygen reservoir layer 500 on the first electrode 200 may include forming the oxygen reservoir layer 500 on the sidewall barrier layer 410, and removing a portion of the oxygen reservoir layer 500 and a portion of the sidewall barrier layer 410 by performing a planarization process as shown in FIG. 4, so that the top surfaces of the sidewall barrier layer 410, the vacancy supply layer 400, and the oxygen reservoir layer 500 are coplanar. In other words, in addition to removing a portion of the oxygen reservoir layer 500, the aforementioned planarization process further includes removing the sidewall barrier layer 410 on the top surface of the vacancy supply layer 400 to expose the top surface of the vacancy supply layer 400. Also, the sidewall barrier layer 410 is disposed between the oxygen reservoir layer 500 and the vacancy supply layer 400. In some embodiments, the oxygen reservoir layer 500 is under a subsequently formed resistive switching layer, and the oxygen reservoir layer 500 may surround the vacancy supply layer 400. In some embodiments, the vacancy supply layer 400 may also surround the oxygen reservoir layer 500. In some embodiments, the vacancy supply layer 400 and the oxygen reservoir layer 500 are arranged alternately with each other.

In some embodiments, the oxygen reservoir layer 500 may include or may be a material, which have ability of storing and/or capturing oxygen ions. In some embodiments, the oxygen reservoir layer 500 may also serve as an oxygen diffusion barrier layer. In some embodiments, the oxygen reservoir layer 500 may include or may be a metal material, such as titanium (Ti), hafnium (Hf), tantalum (Ta), zirconium (Zr), combinations thereof, or other suitable materials, but the present disclosure is not limited thereto.

In some embodiments, the bottom barrier layer 300, the sidewall barrier layer 410, and the oxygen reservoir layer 500 are all disposed on the first electrode 200. Therefore, a barrier layer used to block the diffusion of oxygen ions and a barrier layer used to block the diffusion of the vacancies are disposed on the first electrode 200 at the same time. The oxygen reservoir layer 500 and the bottom barrier layer 300 and the sidewall barrier layer 410 under the oxygen reservoir layer 500 can be used to block the diffusion of oxygen ions. The bottom barrier layer 300 under the vacancy supply layer 400 can be used to block the diffusion of vacancies. The sidewall barrier layer 410 between the vacancy supply layer 400 and the oxygen reservoir layer 500 can block the diffusion of oxygen ions and/or the diffusion of vacancies. In other words, in some embodiments, the present disclosure limits the diffusion direction of oxygen ions and/or vacancies with the specific arrangement of the bottom barrier layer 300, the vacancy supply layer 400, the sidewall barrier layer 410, and the oxygen reservoir layer 500, so as to form a semiconductor structure with two current paths.

Figure 5:
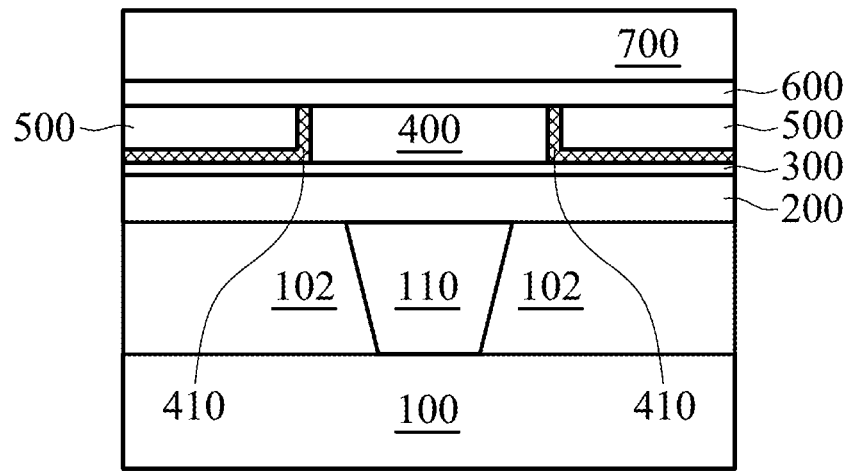

Referring to FIG. 5, a resistive switching layer 600 is formed on the vacancy supply layer 400 so that the resistive switching layer 600 covers the top surface of the vacancy supply layer 400. In some embodiments, in addition to covering the top surface of the vacancy supply layer 400, the resistive switching layer 600 further covers the top surface of the oxygen reservoir layer 500. In some embodiments, the resistive switching layer 600 is disposed between a subsequently formed second electrode and the oxygen reservoir layer 500 to separate the oxygen reservoir layer 500 from the subsequently formed second electrode. In some embodiments, the resistive switching layer 600 is formed on the vacancy supply layer 400, the sidewall barrier layer 410, and the oxygen reservoir layer 500. That is, the vacancy supply layer 400 is under the resistive switching layer 600 and the bottom barrier layer 300 and the sidewall barrier layer 410 may surround the vacancy supply layer 400. In some embodiments, a material of the resistive switching layer 600 includes transition metal oxides. Since the resistance of the transition metal oxide is changed along with the applied bias voltage to produce different resistances, a subsequently formed resistive random access memory is achieved. In some embodiments, the oxygen reservoir layer 500 is closer to the substrate 100 than the resistive switching layer 600. In some embodiments, the resistive switching layer 600 may include or may be a metal oxide, for example, hafnium oxide ($HfO_2$), zirconium oxide ($ZrO_2$), titanium oxide ($TiO_2$), tantalum oxide ($Ta_2O_5$), but the present disclosure is not limited thereto.

In some embodiments, when the bottom barrier layer 300 is aluminum oxide ($Al_2O_3$); the vacancy supply layer 400 is tantalum oxide ($TaO_x$); the sidewall barrier layer 410 is aluminum oxide ($Al_2O_3$); and the oxygen reservoir layer 500 is Titanium (Ti); and the resistive switching layer 600 is a combination of hafnium oxide ($HfO_2$) and aluminum oxide ($Al_2O_3$), it can produce an excellent effect of data preservation. In some embodiments, when the bottom barrier layer 300 is aluminum oxide ($Al_2O_3$); the vacancy supply layer 400 is tantalum oxide ($TaO_x$); the sidewall barrier layer 410 is aluminum oxide ($Al_2O_3$); and the oxygen reservoir layer 500 is tantalum oxide ($Ta_2O_5$); and the resistive switching layer 600 is hafnium oxide ($HfO_2$), it can increase switching number.

As shown in FIG. 5, in some embodiments, a second electrode 700 is formed on the resistive switching layer 600. In some embodiments, a material of the second electrode 700 and a material of the first electrode 200 may be the same or different. In some embodiments, the second electrode 700 may be formed by the aforementioned deposition process or other suitable processes.

Figure 6:
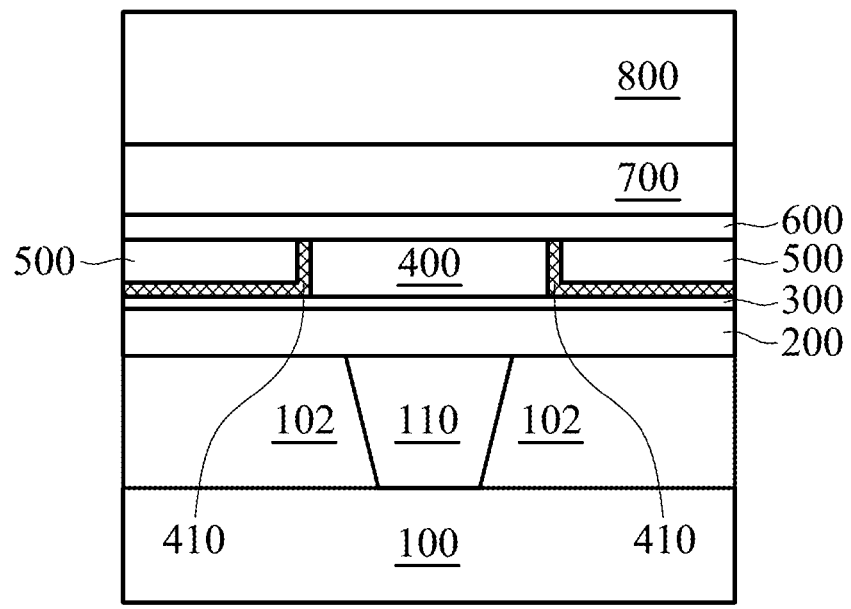

Referring to FIG. 6, in some embodiments, a second dielectric layer 800 is formed on the second electrode 700, and the second electrode 700 is disposed between the second dielectric layer 800 and the resistive switching layer 600. In some embodiments, a material of the second dielectric layer 800 and a material of the first dielectric layer 102 may be the same or different. In some embodiments, the second dielectric layer 800 may be formed by the aforementioned deposition process or other suitable processes. In some embodiments, after the second electrode 700 and the second dielectric layer 800 are formed, the range of the memory cells of the subsequently formed resistive random access memory is defined, and a second via CT is formed to correspond with the required range of the memory cells.

Figure 7:
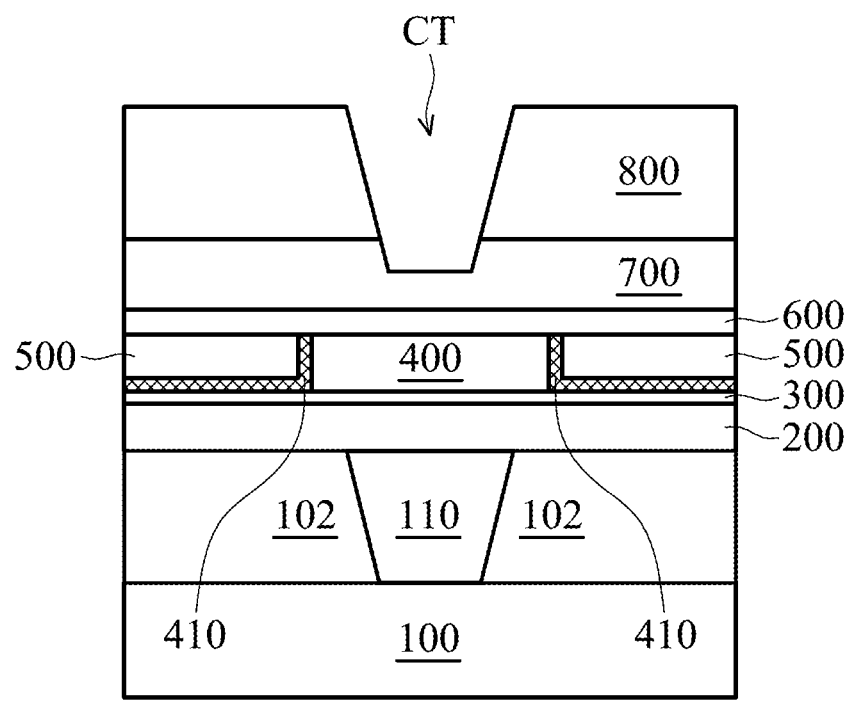

Referring to FIG. 7, in some embodiments, the second via CT is formed in the second dielectric layer 800 to expose a portion of the second electrode 700. In some embodiments, the second via CT penetrates through the second dielectric layer 800 and does not penetrate through the second electrode 700 to expose a portion of the second electrode 700. In some embodiments, in addition to penetrating through the second dielectric layer 800, a portion of the second electrode 700 is further removed to expose a top surface of the remaining second electrode 700. In some embodiments, the second via CT has a width that gradually increases in a direction away from the resistive switching layer 600. In other words, the second via CT may have a structure with a wide top and a narrow bottom. In some embodiments, the second via CT and the aforementioned first via may have the same or different shapes. In some embodiments, a method of forming the second via CT may be the same as or different from the method of forming the first via. In some embodiments, the second via CT is formed to correspond with the position of the first contact plug 110.

Figure 8:
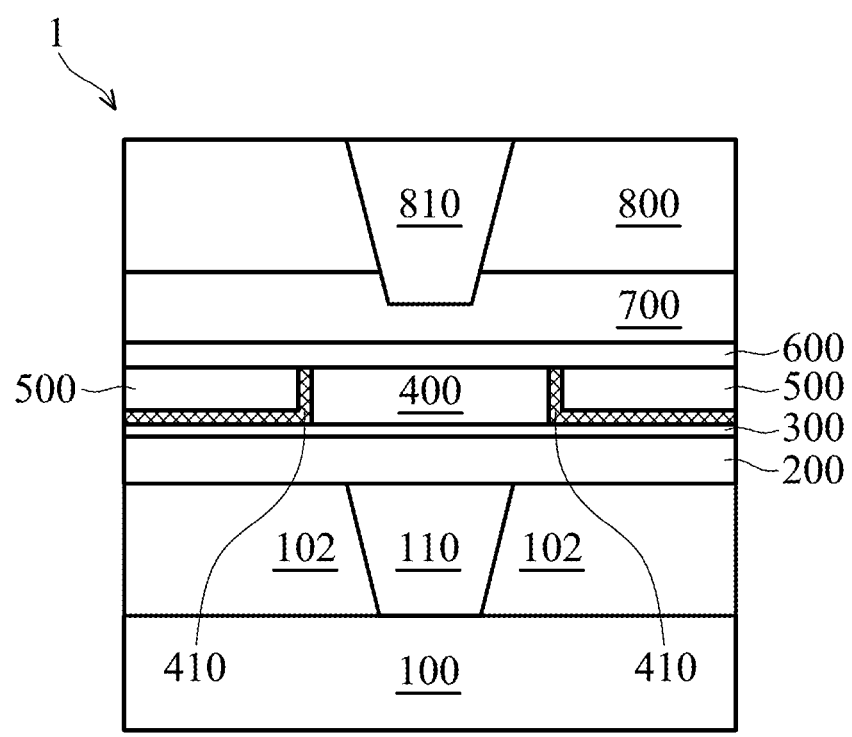

Referring to FIG. 8, in some embodiments, a second conductive material is filled in the second via CT to form a second contact plug 810, and a semiconductor structure 1 is obtained. In some embodiments, the second contact plug 810 is disposed in the second dielectric layer 800, and the second contact plug 810 and the second electrode 700 are in contact with each other to be electrically connected. In some embodiments, after filling the second conductive material into the second via CT, a planarization process may be further performed.

Figure 9:
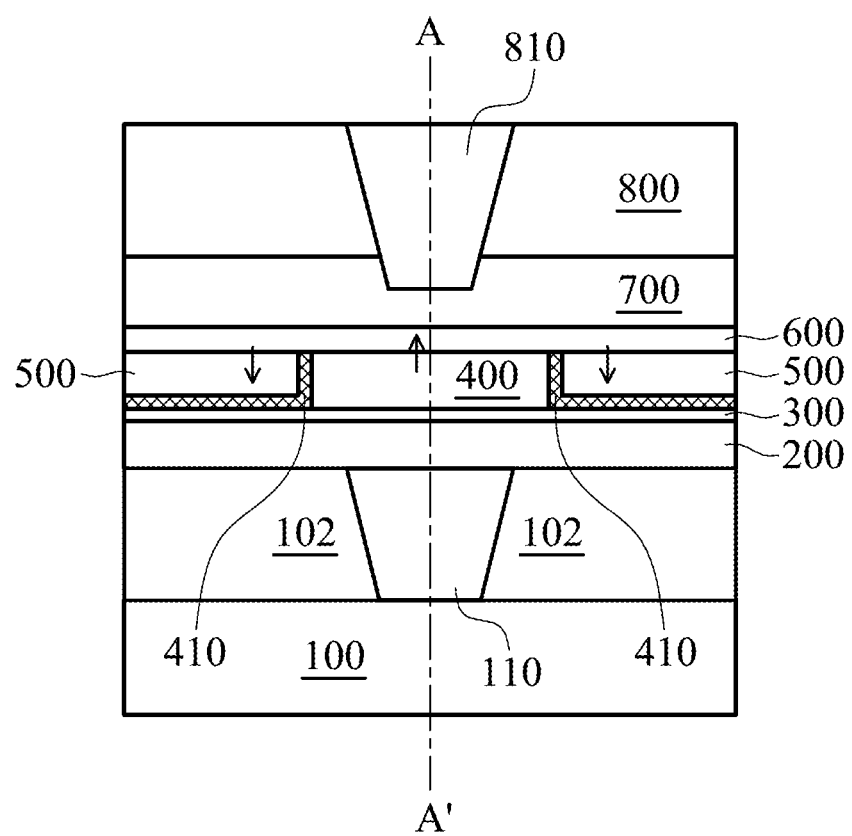
FIG. 9 is schematic cross-sectional views of a semiconductor structure in operation during the forming, according to some embodiments of the present disclosure.

FIG. 9 is schematic cross-sectional views of a semiconductor structure in operation during the forming, according to some embodiments of the present disclosure.

It should be noted that, in some embodiments, the vacancy supply layer 400 is disposed between the first contact plug 110 and the second contact plug 810. In some embodiments, the vacancy supply layer 400, the first contact plug 110, and the second contact plug 810 are aligned with respect to a normal direction of the substrate 100. In some embodiments, as shown in FIG. 9, the vacancy supply layer 400, the first contact plug 110, and the second contact plug 810 are aligned on a normal line AA'. In some embodiments, the vacancy supply layer 400 is under the first contact plug 110 and above the second contact plug 810. In some embodiments, the vacancy supply layer 400 is located directly under the first contact plug 110 and directly above the second contact plug 810. In some embodiments, since the vacancy supply layer 400 is disposed between the first contact plug 110 and the second contact plug 810 and aligned with the first contact plug 110 and the second contact plug 810, a largest electric field can be generated in the semiconductor structure 1, thereby rapidly drives the vacancies in the vacancy supply layer 400 into the resistive switching layer 600.

It should also be noted that, in some embodiments, the bottom barrier layer 300, the sidewall barrier layer 410, and the resistive switching layer 600 effectively isolate the vacancy supply layer 400. In some embodiments, the oxygen ions in the resistive switching layer 600 move along a direction from the second electrode 700 to the first electrode 200, so the oxygen ions in the resistive switching layer 600 are transferred into the oxygen reservoir layer 500 to form an oxygen-ion conduction path. In some embodiments, the vacancies in the vacancy supply layer 400 move along a direction from the first electrode 200 to the second electrode 700, so the vacancies in the vacancy supply layer 400 are transferred into the resistive switching layer 600 to form a vacancy conduction path.

In some embodiments, when a positive bias is applied to the semiconductor structure 1, a breakdown path between the first contact plug 110 and the second contact plug 810 is formed. In some embodiments, when a reverse bias is applied to the semiconductor structure 1, the vacancies of the vacancy supply layer 400 is transferred into the resistive switching layer 600 to form the vacancy conduction path between the first contact plug 110 and the second contact plug 810. Specifically, the vacancy conduction path is formed at a position where the first contact plug 110, the vacancy supply layer 400, and the second contact plug 810 correspond with each other. In some embodiments, a conductive path is formed at an interface between the vacancy supply layer 400 and the resistive switching layer 600. In addition to forming the vacancy conduction path corresponding with the first contact plug 110, the vacancy supply layer 400, and the second contact plug 810, an oxygen-ion conduction path is formed in the position where the first contact plug 110, the vacancy supply layer 400, and the second contact plug 810 do not correspond with each other. That is, the oxygen-ion conduction path is formed at an interface between the oxygen reservoir layer 500 and the resistive switching layer 600. In detail, since the reverse voltage is applied to the semiconductor structure 1, the vacancies in the vacancy supply layer 400 are driven to move upward, that is, from the first electrode 200 toward the second electrode 700 to form the oxygen-ion conduction path. Therefore, the semiconductor structure 1 according to some embodiments of the present disclosure includes both the vacancy conduction path and the oxygen-ion conduction path, the current in the low-resistance state can be increased.

In summary, according to some embodiments of the present disclosure, in an environment where a reverse voltage is applied, the semiconductor device of the present disclosure forms an oxygen-ion conduction path by the oxygen reservoir layer disposed under the resistive switching layer, and the semiconductor device of the present disclosure forms a vacancy conduction path by the vacancy supply layer disposed under the resistive switching layer and surrounded by the oxygen diffusion barrier layer. Thus, the semiconductor structure has both the oxygen-ion conduction path and the vacancy conduction path, thereby increasing the conduction current to obtain improved electrical features. Since there are two conduction paths in the semiconductor structure of some embodiments of the present disclosure, the reliability of the semiconductor structure and the method for forming the same can be improved.

What is claimed is:

1. A semiconductor structure, comprising:
   a substrate;
   a first electrode disposed on the substrate;
   a vacancy supply layer disposed on the first electrode;
   a sidewall barrier layer disposed on the first electrode;
   an oxygen reservoir layer disposed on the first electrode, wherein the sidewall barrier layer is disposed between the oxygen reservoir layer and the vacancy supply layer;
   a resistive switching layer disposed on the vacancy supply layer; and
   a second electrode disposed on the resistive switching layer.

2. The semiconductor structure as claimed in claim 1, wherein the resistive switching layer covers the vacancy supply layer and the oxygen reservoir layer.

3. The semiconductor structure as claimed in claim 1, further comprising:
   a bottom barrier layer disposed on the first electrode, wherein the first electrode is disposed between the substrate and the bottom barrier layer.

4. The semiconductor structure as claimed in claim 3, wherein the bottom barrier layer is disposed between the first electrode and the vacancy supply layer and between the first electrode and the oxygen reservoir layer.

5. The semiconductor structure as claimed in claim 3, wherein the bottom barrier layer, the sidewall barrier layer and the resistive switching layer surround the vacancy supply layer.

6. The semiconductor structure as claimed in claim 1, further comprising:
   a first dielectric layer disposed between the substrate and the first electrode;
   a first contact plug disposed in the first dielectric layer, wherein the first contact plug is in contact with the first electrode;
   a second dielectric layer disposed on the second electrode, wherein the second electrode is disposed between the second dielectric layer and the resistive switching layer; and
   a second contact plug disposed in the second dielectric layer, wherein the second contact plug is in contact with the second electrode.

7. The semiconductor structure as claimed in claim 6, wherein the vacancy supply layer is disposed between the first contact plug and the second contact plug.

8. The semiconductor structure as claimed in claim 6, wherein the vacancy supply layer, the first contact plug, and the second contact plug are aligned in a normal direction of the substrate.

9. The semiconductor structure as claimed in claim 1, wherein the oxygen reservoir layer is closer to the substrate compared with the resistive switching layer.

10. A method for forming a semiconductor structure, comprising:
    forming a first electrode on a substrate;
    forming a vacancy supply layer on the first electrode;
    forming a sidewall barrier layer on the first electrode;
    forming an oxygen reservoir layer on the first electrode, wherein the sidewall barrier layer is disposed between the oxygen reservoir layer and the vacancy supply layer;
    forming a resistive switching layer on the vacancy supply layer; and
    forming a second electrode on the resistive switching layer.

11. The method as claimed in claim 10, wherein the resistive switching layer covers the vacancy supply layer and the oxygen reservoir layer.

12. The method as claimed in claim 10, further comprising:
    forming a bottom barrier layer on the first electrode before the formation of the vacancy supply layer on the first electrode, wherein the first electrode is disposed between the substrate and the bottom barrier layer.

13. The method as claimed in claim 12, wherein the step of formation of the sidewall barrier layer on the first electrode further comprises:
    conformally forming the sidewall barrier layer on a top surface of the bottom barrier layer and a top surface and a side surface of the vacancy supply layer.

14. The method as claimed in claim 10, wherein the steps of formation of the oxygen reservoir layer on the first electrode further comprises:
    forming the oxygen reservoir layer on the sidewall barrier layer; and
    removing a portion of the oxygen reservoir layer and a portion of the sidewall barrier layer so that top surfaces of the sidewall barrier layer, the vacancy supply layer, and the oxygen reservoir layer are coplanar.

15. The method as claimed in claim 10, wherein the steps of formation of the first electrode on the substrate further comprises:
    forming a first dielectric layer on the substrate;
    forming a first via in the first dielectric layer;
    filling a first conductive material into the first via to form a first contact plug; and
    forming the first electrode both on the first dielectric layer and the first contact plug so that the first contact plug is in contact with the first electrode.

16. The method as claimed in claim 15, wherein the steps of formation of the vacancy supply layer on the first electrode further comprises:
    removing the vacancy supply layer which is not corresponding with the first contact plug and remaining the vacancy supply layer which is corresponding with the first contact plug.

17. The method as claimed in claim 10, further comprising:
    forming a second dielectric layer on the second electrode;
    forming a second via in the second dielectric layer to expose a portion of the second electrode; and
    filling a second conductive material into the second via to form a second contact plug in contact with the second electrode.

* * * * *